United States Patent
Smiley et al.

(10) Patent No.: US 7,053,700 B2
(45) Date of Patent: May 30, 2006

(54) HIGH-EFFICIENCY AMPLIFIER AND METHOD

(75) Inventors: Russell Smiley, Nepean (CA); Arthur Fuller, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/449,105

(22) Filed: Jun. 2, 2003

(65) Prior Publication Data

US 2004/0239416 A1  Dec. 2, 2004

(51) Int. Cl.
  *H03F 3/38* (2006.01)
(52) U.S. Cl. .......................................... 330/10; 330/295
(58) Field of Classification Search ................. 330/295, 330/124 R, 10, 207 A, 251, 302
  See application file for complete search history.

(56) References Cited

U.S. PATENT DOCUMENTS

| | | | |
|---|---|---|---|
| 4,810,912 A * | 3/1989 | Theus et al. | 327/437 |
| 4,949,048 A * | 8/1990 | Tokumo et al. | 330/10 |
| 6,268,768 B1 * | 7/2001 | Blodgett | 330/107 |
| 6,710,650 B1 * | 3/2004 | Beaudin et al. | 330/124 R |
| 6,734,725 B1 * | 5/2004 | Masuda et al. | 330/10 |
| 6,747,517 B1 * | 6/2004 | Lautzenhiser et al. | 330/295 |
| 6,788,137 B1 * | 9/2004 | Morita | 330/10 |
| 2002/0053945 A1 | 5/2002 | Putzeys | |

OTHER PUBLICATIONS

Iwamoto, M.; Jayaraman, A.; Hanington, G.; Chen, P.F.; Bellora, A.; Thornton, W.; Larson, L.E.; Asbeck, P.M.; Bandpass Delta-Sigma Class-S Amplifier; Electronics Letters, vol. 36, No. 12; Jun. 12, 2000; pp. 1010-1012.

Tousi, Vahid M.; Sahandi, F.; Atarodi, M.; Shojaei, M.; A 3.3V/1W Class D Audio Power Amplifier With 103dB DR and 90% Efficiency; IEEE, 2002, pp. 581-584.

Jayaraman, Arun; Chen, P.F.; Hanington, G.; Larson, L.; Asbeck, P.; Linear High-Efficiency Microwave Power Amplifiers Using Bandpass Delta-Sigma Modulators; IEEE, 1998, pp. 121-123.

Keyzer, J.; Hinrichs, J.; Metzger, M.; Iwamoto, I.; Galton, I.; Asbeck, P.; Digital Generation of RF Signals for Wireless Communications With Band-Pass Delta-Sigma Modulation; IEEE, 2001; pp. 2127-2130.

(Continued)

*Primary Examiner*—Henry Choe (57) ABSTRACT

Methods and apparatus are provided for efficiently amplifying a signal. An input signal is decomposed into a plurality of two state signals, each two state signal having a respective on level and off level. This may involve sigma-delta modulation and phase splitting. Each of the two state signals is amplified with a respective switching power amplifier to produce a respective amplified signal. The amplified signals are combined to produce an amplified version of the input signal.

24 Claims, 4 Drawing Sheets

OTHER PUBLICATIONS

Aziz, Pervez M.; Sorensen, Henrik V.; Van Der Spiegel, Jan; An Overview of Sigma-Delta Converters; IEEE Signal Processing Magazine, Jan. 1996; pp. 61-84.

Watanabe, S. et al. "DSP-based High Precision Current Tracking Control of Gradient Coil in Two-Paralleled PWM Amplifiers for MRI Systems", Power Electronics Specialists Conference, 1998. PESC 98 Record. 29th Annual IEEE Fukuoka, Japan May 17-22, 1998. New York, NY USA. pp. 916-921, XP010294962. ISBN: 0-7803-4489-8.

Antunes, V. M. E., et al. "Harmonic Distortion Reduction in Multi-Level PWM Modulators for Audio Power Amplifiers". IECON-2002. Proceedings of the 28th Annual Conference of the IEEE Industrial Electronics Society. New York, NY. IEEE USA vol. 1 of 4. Nov. 5, 2002. pp. 852-857, XP010633268. ISBN: 0-7803-7474-6.

* cited by examiner

FIG. 4

HIGH-EFFICIENCY AMPLIFIER AND METHOD

FIELD OF THE INVENTION

The invention relates to high-efficiency amplifiers and methods.

BACKGROUND OF THE INVENTION

Power amplifiers account for a significant portion of the capital and operational expense in current wireless base station designs. One method of reducing this expense is to increase the overall efficiency of these amplifiers. In order to obtain high-efficiency amplifiers, one approach which has been tried is to modulate the amplifier's PSU (power supply unit) in order to track the input envelope of the modulated signal. This in turn requires that one must have a high-efficiency PSU which supports the desire to modulate the PSU, while at the same time, does not introduce any impairments into the main signal path.

A number of high-efficiency architectures have been proposed, particularly in the audio field. However, these architectures typically consist of a single phase and are not capable of supporting the power levels and input bandwidths required for RF applications.

Improvements in efficiency of power amplifiers would benefit low-frequency, high-frequency and radio-frequency amplifier applications.

Sigma-Delta modulation allows noise shaping such that the noise of the modulated signal lies mostly out-of-band. Filtering off the out-of-band noise substantially restores the original signal. See for example Sharp "An Overview of Sigma-Delta Converters", (IEEE Signal Processing Magazine, January 1996), SM-SX1 Sigma-Delta Audio Amplifier (IEEE Spectrum, March 2000), "Bandpass delta-sigma class-S amplifier", Electr. Letters, Vol. 36, No. 12, June 2000, "Linear High-Efficiency Microwave Power Amplifiers Using Bandpass Delta-Sigma Modulators", Jayaraman et al., IEEE Micr. & Guided Wave Letters, Vol. 8, No. 3, March 1998, "Linear Amplification by Sampling Techniques: A new application for Delta Coders", Cos, IEEE Trans. Comm., Vol. Com-23, No. 8, August 1975. Conventional applications for Sigma-Delta modulation have focussed on analog inputs, and have produced single-bit outputs only. Single bit systems require a very high over-sampling rate to achieve acceptable performance. Multi-bit Sigma-Delta modulators have also been proposed. Sigma-Delta modulation takes an input signal and converts it to an N-level quantized Sigma-Delta signal. The input signal can be in the form of an analog signal or a digital signal.

SUMMARY OF THE INVENTION

Power amplifiers account for a significant portion of the capital and operational expense in many systems, for example in current wireless base station designs. Any increase in efficiency has the potential to dramatically decrease both of these expenses.

According to one broad aspect, the invention provides a method comprising: decomposing an input signal into a plurality of two state signals, each two state signal having a respective on level and off level; amplifying each of the plurality of two state signals with a respective switching power amplifier to produce a respective amplified signal; combining the amplified signals to produce an amplified version of the input signal.

In some embodiments, for each two state signal, the respective on level is sufficient to saturate the respective switching power amplifier. However, saturation is only required in the sense that the conventional understanding of high efficiency amplifiers expects them to saturate. Future implementations of high efficiency or switching amplifiers could conceivably not be required to saturate to achieve high efficiency.

In some embodiments, decomposing the input signal into the plurality of two state signals comprises: processing the signal with an N level Sigma-Delta modulator to produce a quantized signal having N levels, where $N \geq 3$; performing a phase splitting function on the quantized signal to produce N−1 signals described here as "phases", the plurality of two state signals consisting of the N−1 signals.

In some embodiments, decomposing the input signal into the plurality of two state signals is done in a manner which substantially equalizes numbers of switching transitions between the switching power amplifiers.

In some embodiments, decomposing the input signal into the plurality of two state signals is done subject to a minimum on time constraint for each switching power amplifier and/or specified minimum and/or maximum time between transitions.

In some embodiments, decomposing the input signal into the plurality of two state signals is done subject to a minimum on time constraint for each switching power amplifier.

In some embodiments, the method further comprises: performing a partial filtering function on each amplified signal prior to combining the amplified signals, and performing a final filtering function on the amplified version of the input signal.

In some embodiments, the method further comprises: performing a filtering function on each amplified signal prior to combining the amplified signals.

In some embodiments, the method further comprises: performing a final filtering function on the amplified version of the input signal.

In some embodiments, the method further comprises: applying the amplified version of the signal as a power supply signal to a power amplifier.

In some embodiments, the input signal tracks an envelope of another signal to be amplified by the power amplifier.

According to another broad aspect, the invention provides a system comprising: means for decomposing a signal into a plurality of two state signals, each two state signal having a respective on level and off level; means for amplifying each of the plurality of two state signals with a respective switching power amplifier to produce a respective amplified signal; means for combining the amplified signals to produce an amplified version of the signal.

According to another broad aspect, the invention provides an apparatus comprising: a signal decomposing circuit adapted to decompose an input signal into a plurality of two state signals, each two state signal having a respective on level and off level; for each of the plurality of two states signals, a respective switching power amplifier adapted to amplify the two state signal to produce a respective amplified signal; a combiner adapted to combine the amplified signals to produce an amplified version of the signal.

In some embodiments, for each two state signal, the respective on level is sufficient to saturate the respective switching power amplifier.

In some embodiments, the signal decomposing circuit comprises: an N level Sigma-Delta modulator which produces a quantized signal having N levels, where $N \geq 3$; a phase splitting function adapted to process the quantized signal to produce N−1 signals, the plurality of two state signals consisting of the N−1 signals.

In some embodiments, the signal decomposing circuit decomposes the signal into the plurality of two state signals in a manner which substantially equalizes numbers of switching transitions between the switching power amplifiers.

In some embodiments, the signal decomposing circuit decomposes the signal subject to a minimum on time constraint for each switching power amplifier.

In some embodiments, the signal decomposing circuit decomposes the signal subject to a minimum off time constraint for each switching power amplifier and/or subject to specified minimum and/or maximum time between transitions.

In some embodiments, performing a phase splitting function on the quantized signal to produce N−1 signals, the plurality of two state signals consisting of the N−1 signals comprises for each quantized signal output "currentIn", if currentIn is the same as a previously processed quantized signal output "lastIn", making no changes to the plurality of two state signals; if currentIn is less than lastIn, determining a set X of signals that are currently off are determined, from that set X, selecting the signals with the least number of switching events and activating the selected signals; if currentIn is greater than lastIn, determining a set X of signals that are currently, from the set X, selecting the phases with the least number of switching events and deactivating the selected signals.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
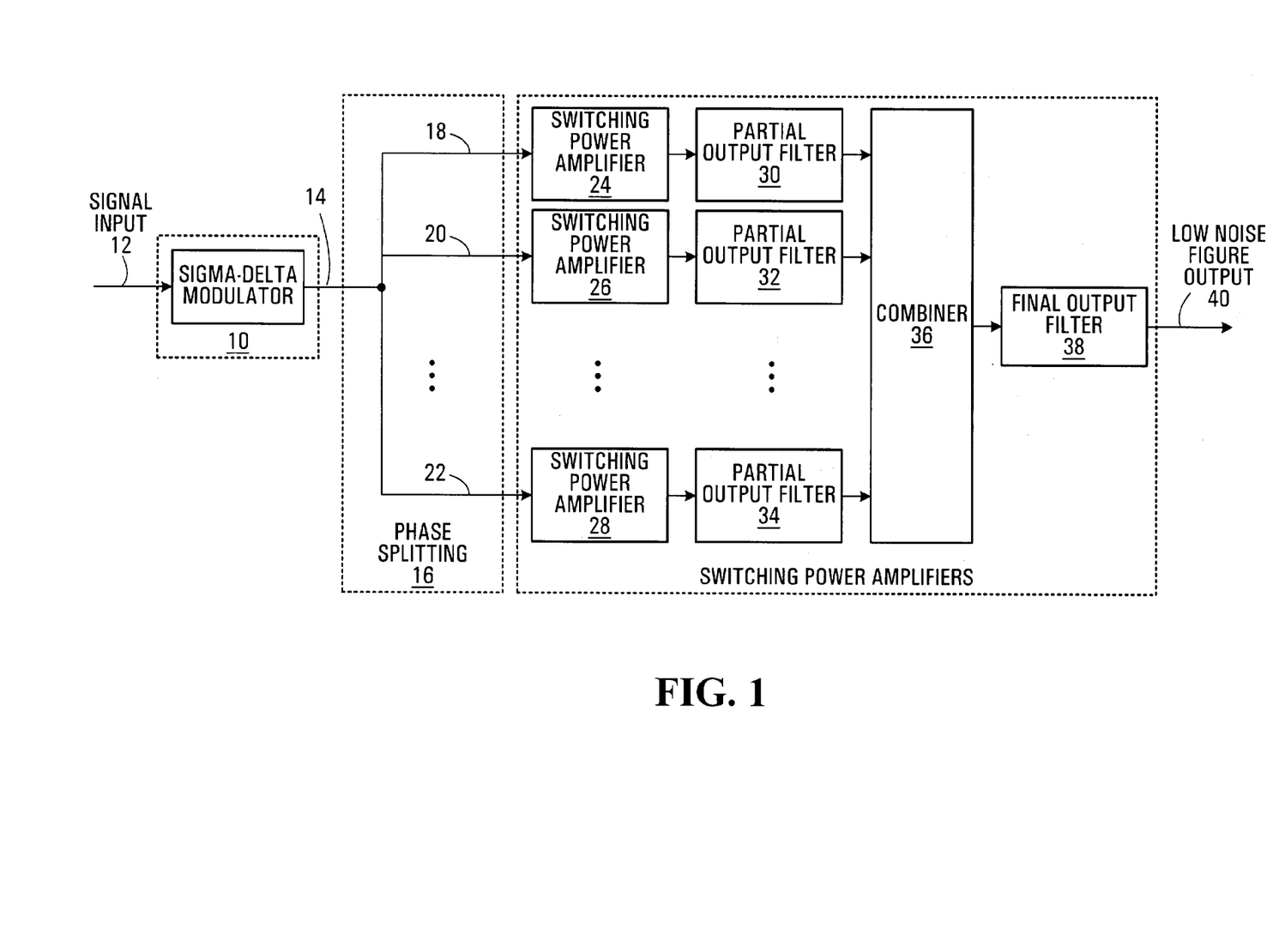
FIG. 1 is a block diagram of a amplifying system provided by an embodiment of the invention.

Referring now to FIG. 1, shown is a block diagram of a high-efficiency amplification system using an N-level Sigma-Delta modulator, N≧3 as provided by an embodiment of the invention. The Sigma-Delta modulator 10 is connected to receive an input signal and produce an N-level Sigma-Delta modulated output signal 14. A phase splitting function generally indicated at 16 takes the Sigma-Delta modulated signal 14 and produces a set of N−1 "phases" 18,20,22 (only three shown). The N−1 phases 18,20,22 collectively sum to equal the Sigma-Delta modulated signal 14 at any instant. Each of the N−1 phases 18,20,22 is connected to the input of a respective one of N−1 switching power amplifiers 24,26,28 (only three shown). The outputs of the switching power amplifiers 24,26,28 are connected to respective partial output filters 30,32,34 (only three shown). The outputs of the partial output filters 30,32,34 are connected to inputs of a combiner 36 having an output connected to a final output filter 38 which produces the overall output 40. The Sigma-Delta modulator 10 provides the benefit of noise shaping as compared to other modulation techniques. In this way, quantization noise is "pushed" out of the band of interest, allowing it to be eventually filtered off without negatively impacting the desired signal.

In operation, the Sigma-Delta modulator 10 processes the input signal to produce the Sigma-Delta modulated signal 14. The input signal can be an analog signal or a digital signal, and this will of course affect the implementation Sigma-Delta modulator. For RF amplifier applications, the input signal is the RF signal to be amplified. For power supply unit applications (described in detail below), the input signal is the envelope of an RF input signal. The sigma-delta modulated signal 14 consists of an N level quantized signal representable by $\log_2(N)$ bits. It is noted that N does not necessarily have to be a power of 2. For example, if there are four levels, then the output of the Sigma-Delta modulator 14 can be represented by two bits. The phase splitting function 16 processes the Sigma-Delta modulated signal 14 to produce signal phases 18,20,22 which sum to equal the Sigma-Delta modulated signal. However, each of the phase signals is a two state signal meaning that it is either on or off and each of the phase signals 18,20,22 has an on state which will saturate the respective switching power amplifier 24,26,28 to which it is fed. Thus, signal phase 18 has an on state which will saturate switching power amplifier 24, phase 20 will have an on state which will saturate switching power amplifier 26, and signal phase 22 will have an on state which will saturate switching power amplifier 28. In a preferred embodiment, the on states for the N−1 phases produced in the phase splitting block 16 are equal so that the N−1 switching power amplifiers 24,26, 28 can be made identical. The phase splitting function 16 needs to produce N−1 2-level signals, where the Sigma-Delta modulator 10 produced an N level Sigma-Delta modulated signal 14. Several examples of the phase splitting function 16 are presented in detail below.

Figure 2:
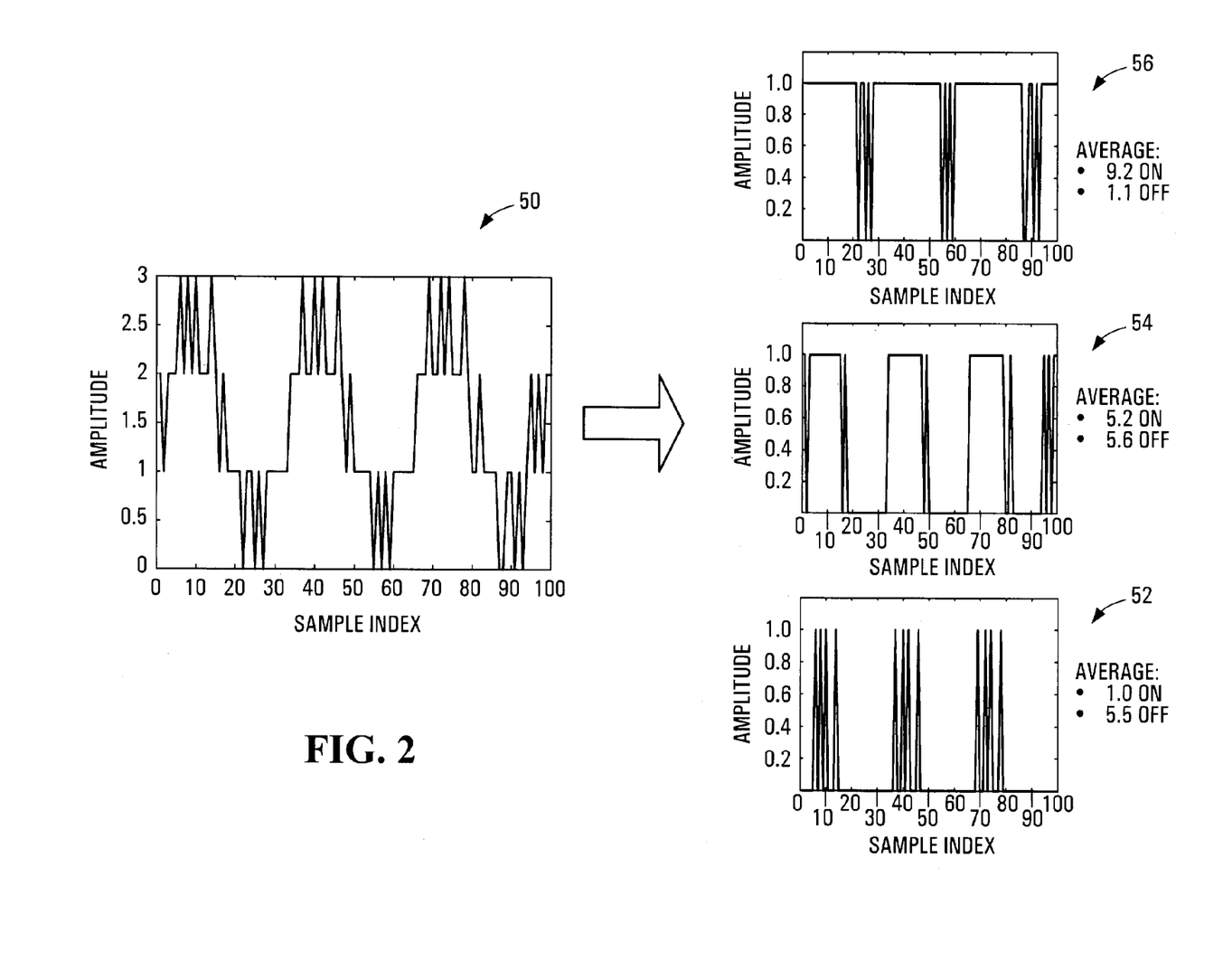
FIG. 2 is an example of how phase allocation can be performed by the phase splitting function of FIG. 1.

Each of the switching power amplifiers 24,26,28 perform switching power amplification on the respective input signals 18,20,22. Any suitable switching amplifier topology can be employed. Eligible topologies include but are not limited to class D, class S, class E and class F amplifiers, and buck, boost and flyback converters. The amplified signals produced by the switching power amplifiers 24,26,28 are filtered and partial output filters 30,32,34. The outputs of the partial output filters 30,32,34 are summed with combiner 36. This can be implemented with any suitable combining technology. The combiner produces a combined signal which is output to the final output filter 38 which filters out-of-band noise to produce the overall output 40. The partial output filters and the overall output filter achieve an overall filter response. If the desired signal has a lowpass characteristic the overall filter response should be lowpass. If the desired signal is bandpass the overall filter should be bandpass. The filter matches the desired signal. Typically in the power supply or audio application the desired overall output filter response is lowpass. Those skilled in the art will know how to divide the overall response into two filters (a partial output filter and final output filter) that when combined achieved the desired overall response. FIG. 2 shows a simple "thresholding" phase allocation scheme implementable in the phase splitting function 16. For this example, the Sigma-Delta modulated signal 14 of FIG. 1 is generally indicated by 50. It can be seen that this is a four level signal, with the output having either a value of 0, 1, 2, or 3 with appropriate brief transition periods between these Sigma-Delta states. With thresholding phase allocation, a first phase is simply defined to be any portion of the Sigma-Delta modulated signal greater than quantization level "2". An example of such a signal is indicated at 52. The next phase will simply be any portion of the signal greater than quantization level "1". An example of such a signal as indicated generally at 54. Finally, the third phase is simply that portion of the Sigma-Delta modulated signal which is greater than quantization level "0". An example of this is indicated generally at 56. It can be seen that a sum of signals 52,54,56 would equal the signal 50. The three signals 52,54,56 are all substantially two state signals, oscillating between 0 and 1. In this example it is of course assumed that the on state has been normalized to 1. More generally, the on state would need to be a value which saturates the switching power amplifiers. This particular phase splitting methodology has the disadvantage that the switching power amplifier responsible for amplifying the lowest phase, namely the signal content between "0" and "1" will be on much more of the time than the switching power amplifier responsible for amplifying the largest phase 52. In the illustrated example, the average on time for the lowest phase is 9.2 samples and the average off time 1.1 samples. For the medium phase, the average on time is 5.2 samples and the average off time is 5.6 samples. Finally, the average on time for the highest phase 52 is 1 sample and the average off time is 5.5 samples. It is noted that in the illustrated example, the first phase 52 has more transitions than the third phase 56. the number of transitions affects efficiency.

In another embodiment, a more intelligent phase splitting method is employed in the phase splitting function 16. This method attempts to reduce the number of switching events that will occur in each of the resulting two-level signals while at the same time equalizing the switching events between the phases. If the modulator produces equal size quantization steps, then the output of the Sigma-Delta converter can be considered to indicate how many phases of the converter need to be active, without specifying which of the phases are active. The phase splitting function 16 then allocates the on states between the phases to achieve desired switching characteristics. In a preferred implementation, there is a substantially equal distribution of on and off states among the phases. Reducing the number of transitions (off→on, on→off) increases the efficiency.

Other constraints can be imposed upon the phase splitting function 16. For example, there can be maximum on time or maximum off time for any of the switching power amplifiers.

Figure 4:
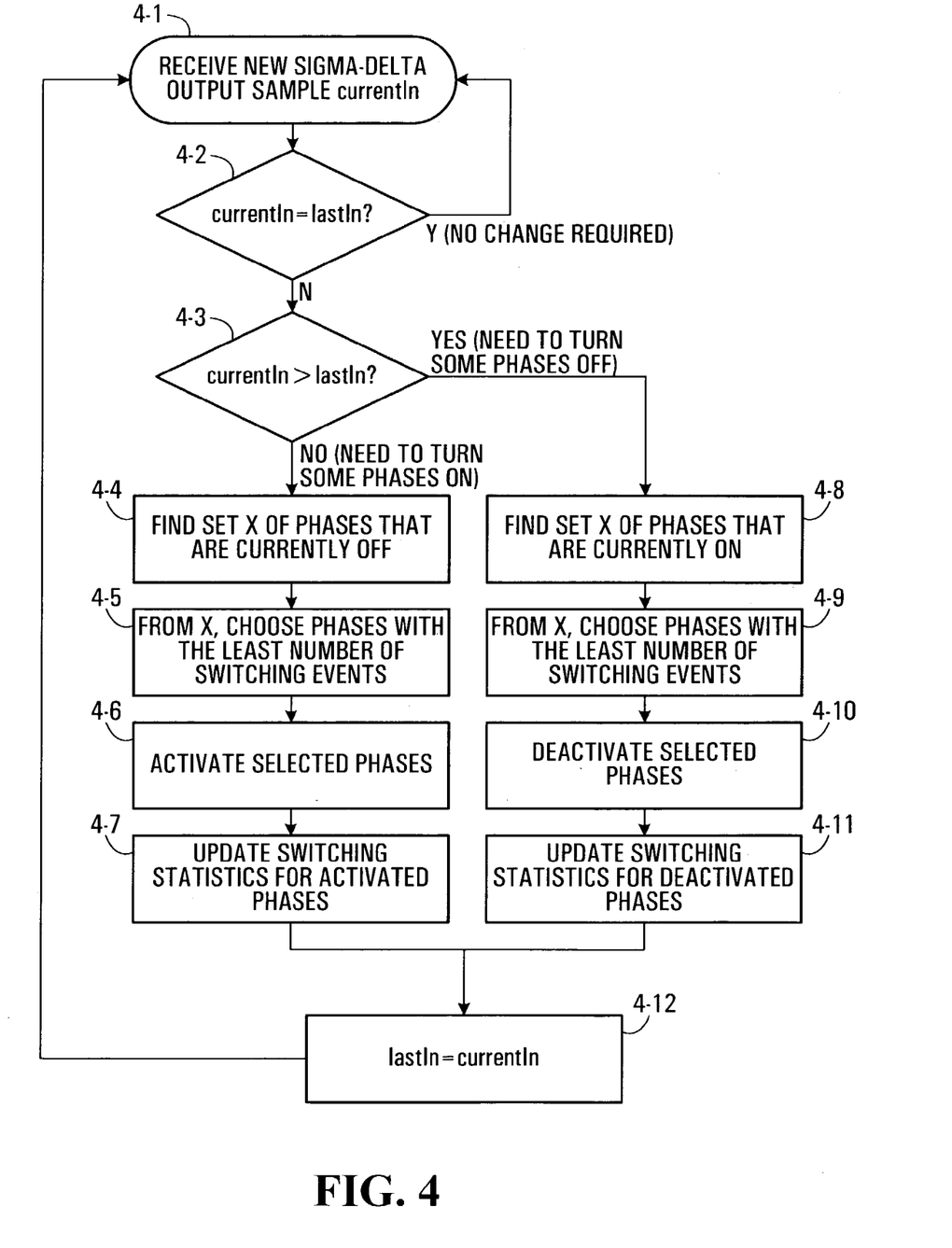
FIG. 4 is a flowchart of a method of phase allocation.

FIG. 4 is a flowchart of an example phase splitting function 16. The method begins at step 4-1 with the reception of a new Sigma-Delta output sample "currentIn". At step 4-2, if currentIn is the same as the previously processed sample referred to as "lastIn", (yes path) then the method returns to step 4-1 to process the next sample. Otherwise, at step 4-3, if currentIn is less than lastIn then some phases need to be turned off, and steps 4-8 through 4-11 are executed. Otherwise, if currentIn is greater than lastIn then some phases need to be turned on and steps 4-4 through 4-7 need to be executed. In either case, at step 4-11, lastIn is set to equal currentIn and used in subsequent processing.

In order to turn phases on, the set X of phases that are currently off are determined at step 4-4. From that set X, the phases with the least number of switching events are selected at step 4-5. The selected phases are activated at step 4-6. Finally, at step 4-7, the switching statistics for the activated phases are updated.

Similarly, to turn phases off, at step 4-8, the set X of phases that are currently on is identified. At step 4-9, from the set X the phases with the least number of switching events are chosen. At step 4-10, the selected phases are de-activated. Finally, at step 4-11, the switching statistics for the de-activated phases are updated.

This is a very specific example which has been found by experimentation to yield very good results. However, it is to be understood that many other methods of distributing the switching events between the different phases may be employed within the scope of the invention.

In the above-described embodiment, each phase includes a partial filter which eliminates some of the out-of-band noise signals. After the phases are combined, the final output filter 38 eliminates any remaining out-of-band noise signals. In another alternative embodiment, there are no partial output filters 30,32,34. Rather, the outputs of the amplifier phases are directly combined so that the sum of each phase results in the original desired signal including out-of-band noise signals generated by the sigma-delta modulator 10. A filter is then applied to the combined output signal to exclude the out-of-band noise while retaining the desired original signal. In another alternative embodiment, each amplifier phase includes a respective filter that entirely excludes the out-of-band noise signal. The summation of the phases thus filtered would then only include the desired original signal. In this case, there would be no requirement for the final output filter 38 of FIG. 1.

Figure 3:
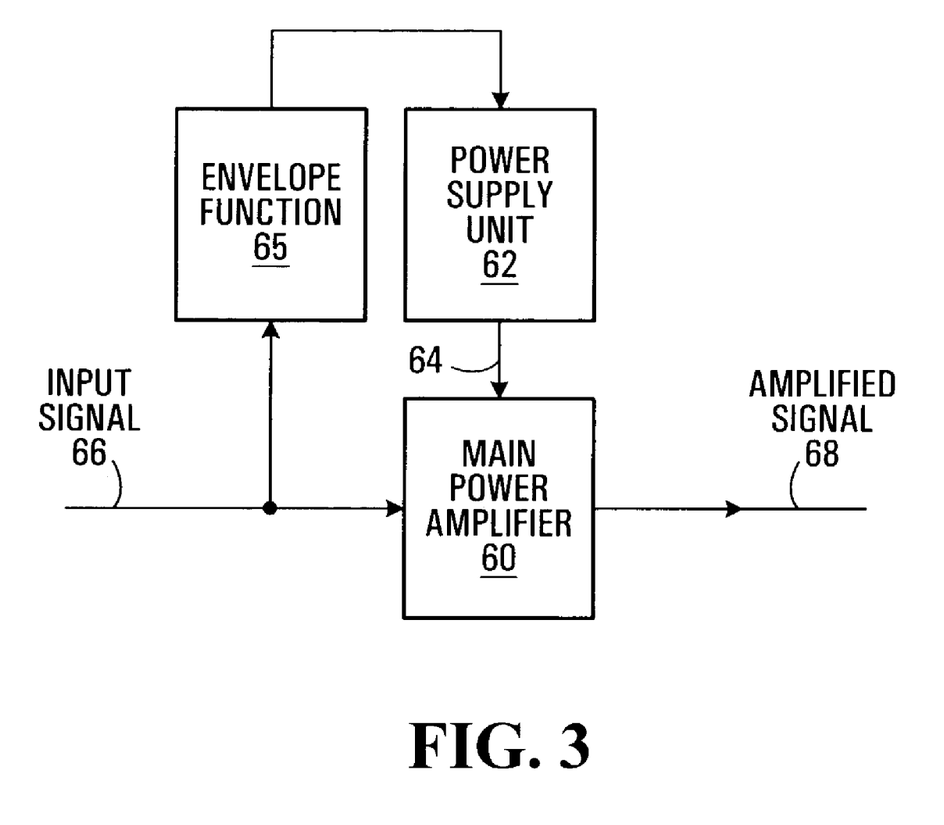
FIG. 3 is a block diagram of a power supply unit application of the amplifier of FIG. 1.

In the above-described embodiment, the new amplification approach has been applied directly to an input signal to produce an amplified output signal. In another embodiment, the method is applied to an N amplifier PSU in order to track the input envelope of the main amplifier. A block diagram of this embodiment is shown in FIG. 3. In this embodiment, shown is a main power amplifier 60 powered by a power supply unit 62. The power supply unit is a high-efficiency amplifier using Sigma-Delta modulation, for example as shown in FIG. 1. This generates a power supply signal 64 which powers the main power amplifier 60. The input signal 66 is amplified by the main power amplifier 60 to produce an amplified output signal 68. The input signal 66 is also fed through an envelope function 65 to the input of the power supply unit 62 such that the power supply signal 64 tracks the envelope of input signal.

The above example implementation has focussed on the use of a Sigma-Delta modulator to generate the quantized signal, and a phase splitting function 16 to generate the various phases. More generally, any appropriate circuit or method can be employed to decompose an input signal into a set of phases each one of which will independently drive a respective switching power amplifier between an off state and a saturation state. The Sigma-Delta modulator approach has the advantage of shifting the noise outside the operational bandwidth, and as such allows the noise to be very easily filtered off. However, it is to be understood that other modulation methods will have their own noise characteristics which can be dealt with in their own way.

Any suitable hardware implementation can be used to build the architecture of FIG. 1. For example, for in one embodiment the Sigma-Delta modulator is on a first circuit, for example an ASIC or FPGA. The phase splitting function 16 is a second circuit. Each of the switching power amplifiers is a respective circuit, and the output filters, combiners and final output filters together are a separate circuit. This results in a total of N+3 circuits to build the architecture. Of course, it is to be understood that other combinations of functionality on different circuits could be employed. Furthermore, it is to be understood that the phase splitting function 16 could be implemented in software. Furthermore, some implementations of the Sigma-Delta modulator 10 could be implemented partially or completely in software.

The filtering functions may be implemented using special purpose filters implemented in hardware, or maybe implemented using general purpose filter blocks which are tuned to achieve the desired function, or other filtering technology can alternatively be employed.

It is noted that increasing N (the number of levels) improves noise performance without having to increase the over-sampling ratio as large as would be required in single bit Sigma-Delta applications. Preferably, N is minimized subject to a constraint of meeting the required noise performance and subject to $N \geq 3$.

Numerous modifications and variations of the present invention are possible in light of the above teachings. It is therefore to be understood that within the scope of the appended claims, the invention may be practised otherwise than as specifically described herein.

What is claimed is:

1. A method comprising:
   decomposing an input signal into a plurality of two state signals, each two state signal having a respective on level and off level;
   amplifying each of the plurality of two state signals with a respective switching power amplifier to produce a respective amplified signal;
   combining the amplified signals to produce an amplified version of the input signal;
   wherein decomposing comprises:
      processing the input signal to produce a quantized signal having N levels, where $N \geq 3$; and
      performing a phase splitting function on the quantized signal to produce N−1 signals, the plurality of two state signals consisting of the N−1 signals.

2. A method according to claim 1 wherein for each two state signal, the respective on level is sufficient to saturate the respective switching power amplifier.

3. A method according to claim 2 wherein:
   processing the signal to produce a quantized signal having N levels, where $N \geq 3$ comprises processing the signal with an N level Sigma-Delta modulator.

4. A method according to claim 1 wherein decomposing the input signal into the plurality of two state signals is done in a manner which substantially equalizes numbers of switching transitions between the switching power amplifiers.

5. A method according to claim 1 wherein decomposing the input signal into the plurality of two state signals is done subject to a minimum on time constraint for each switching power amplifier.

6. A method according to claim 1 wherein decomposing the input signal into the plurality of two state signals is done subject to a minimum off time constraint for each switching power amplifier.

7. A method according to claim 3 wherein decomposing the input signal into the plurality of two state signals is done subject to a minimum and/or maximum time between transitions.

8. A method according to claim 1 wherein decomposing the input signal into the plurality of two state signals is done in a manner which substantially equalizes numbers of transitions between the switching power amplifiers.

9. A method according to claim 3 wherein performing a phase splitting function on the quantized signal to produce N−1 signals, the plurality of two state signals consisting of the N−1 signals comprises:
   for each quantized signal output "currentIn", if currentIn is the same as a previously processed quantized signal output "lastIn", making no changes to the plurality of two state signals;
   if currentIn is less than lastIn, determining a set X of signals that are currently off are determined, from that set X, selecting the signals with the least number of switching events and activating the selected signals;
   if currentIn is greater than lastIn, determining a set X of signals that are currently, from the set X, selecting the phases with the least number of switching events and deactivating the selected signals.

10. A method according to claim 1 wherein decomposing the input signal into the plurality of two state signals is done subject to a minimum on time constraint for each switching power amplifier.

11. A method according to claim 1 wherein decomposing the input signal into the plurality of two state signals is done subject to a minimum off time constraint for each switching power amplifier.

12. A method according to claim 1 wherein decomposing the input signal into the plurality of two state signals is done subject to a minimum and/or maximum time between transitions.

13. A method according to claim 1 further comprising:
    performing a partial filtering function on each amplified signal prior to combining the amplified signals, and performing a final filtering function on the amplified version of the input signal.

14. A method according to claim 1 further comprising:
    performing a filtering function on each amplified signal prior to combining the amplified signals.

15. A method according to claim 1 further comprising:
    performing a final filtering function on the amplified version of the input signal.

16. A method comprising:
    decomposing an input signal into a plurality of two state signals, each two state signal having a respective on level and off level;
    amplifying each of the plurality of two state signals with a respective switching power amplifier to produce a respective amplified signal;
    combining the amplified signals to produce an amplified version of the input signal;
    applying the amplified version of the signal as a power supply signal to a power amplifier;
    wherein the input signal tracks an envelope of another signal to be amplified by the power amplifier.

17. An apparatus comprising:
    a signal decomposing circuit adapted to decompose an input signal into a plurality of two state signals, each two state signal having a respective on level and off level;
    for each of the plurality of two states signals, a respective switching power amplifier adapted to amplify the two state signal to produce a respective amplified signal;
    a combiner adapted to combine the amplified signals to produce an amplified version of the signal;
    wherein the signal decomposing circuit comprises:
       a modulator which produces a quantized signal having N levels, where $N \geq 3$;
       a phase splitting function adapted to process the quantized signal to produce N−1 signals, the plurality of two state signals consisting of the N−1 signals.

18. An apparatus according to claim 17 wherein for each two state signal, the respective on level is sufficient to saturate the respective switching power amplifier.

19. An apparatus according to claim 17 wherein the modulator is an N level Sigma-Delta modulator.

20. An apparatus according to claim 17 wherein the signal decomposing circuit decomposes the signal into the plurality of two state signals in a manner which substantially equalize numbers of transitions between the switching power amplifiers.

21. An apparatus according to claim 17 wherein the signal decomposing circuit decomposes the signal subject to a minimum on time constraint for each switching power amplifier and/or subject to specified minimum and/or maximum time between transitions.

22. An apparatus according to claim 17 wherein the signal decomposing circuit decomposes the signal subject to a minimum off time constraint for each switching power amplifier.

23. An apparatus according to claim 17 wherein the signal decomposing circuit decomposes the signal subject to a minimum and/or maximum time between transitions.

24. An apparatus according to claim 19 wherein the phase splitting function is adapted to:
- for each quantized signal output "currentIn", if currentIn is the same as a previously processed quantized signal output "lastIn", make no changes to the plurality of two state signals;
- if currentIn is less than lastIn, determine a set X of signals that are currently off are determined, from that set X, select the signals with the least number of switching events and activate the selected signals;
- if currentIn is greater than lastIn, determine a set X of signals that are currently, from the set X, select the phases with the least number of switching events and deactivate the selected signals.

* * * * *